United States Patent [19]

Ishimoto

[11] 4,354,259

[45] Oct. 12, 1982

[54] SEMICONDUCTOR MEMORY DEVICE HAVING IMPROVED COLUMN SELECTION STRUCTURE

[75] Inventor: Shoji Ishimoto, Tokyo, Japan

[73] Assignee: Nippon Electric Co., Ltd., Tokyo, Japan

[21] Appl. No.: 137,182

[22] Filed: Apr. 4, 1980

[30] Foreign Application Priority Data

Apr. 4, 1979 [JP] Japan .................................. 54-40674

[51] Int. Cl.³ ............................................. G11C 8/00
[52] U.S. Cl. ................................................. 365/230
[58] Field of Search ........................................ 365/230

[56] References Cited

U.S. PATENT DOCUMENTS 3,828,320  8/1974  Dinerman et al. .................. 364/200
4,050,061  9/1977  Kitagawa ............................ 365/149

Primary Examiner—Stuart N. Hecker
Attorney, Agent, or Firm—Sughrue, Mion, Zinn, Macpeak & Seas

[57] ABSTRACT

A memory device operable at high-speed and with low power consumption is disclosed. The device in which row address information and column address information are incorporated in synchronism with a row strobe signal and a column strobe signal, respectively, and refresh is effected in response to a row address, comprises a plurality of groups of selection gates for selectively supplying the incorporated column address information to a part of a plurality of column address decoders.

8 Claims, 12 Drawing Figures

FIG. 5
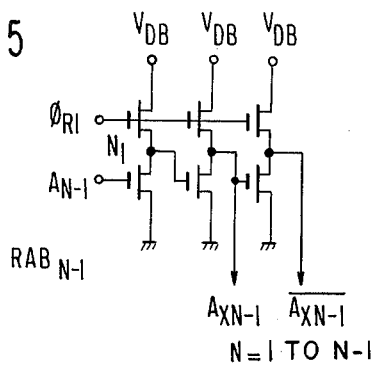
FIG. 7
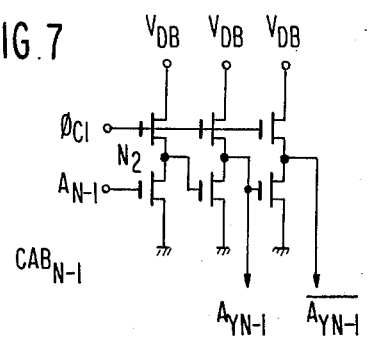
FIG. 6
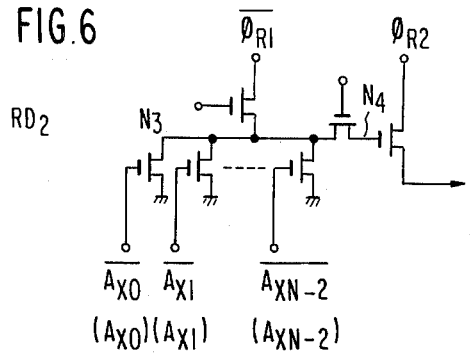
FIG. 8
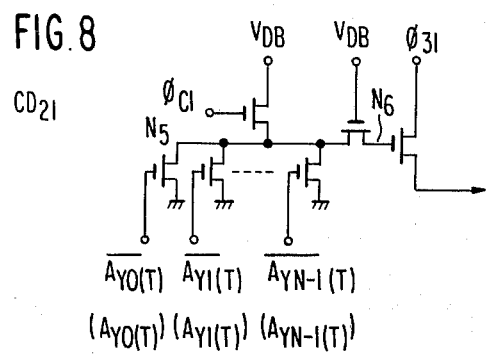
FIG. 10
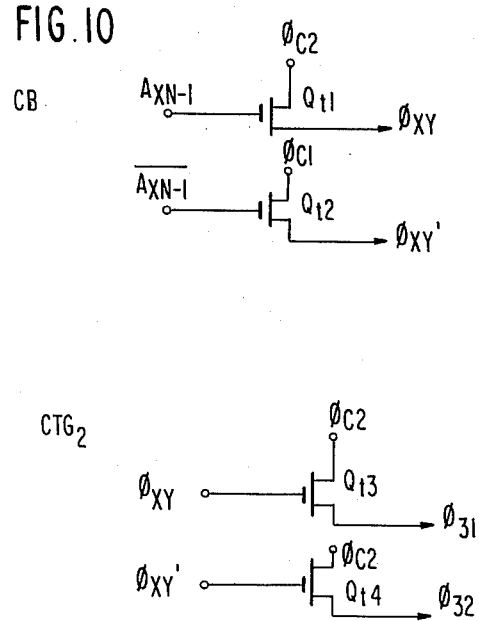
FIG. 9
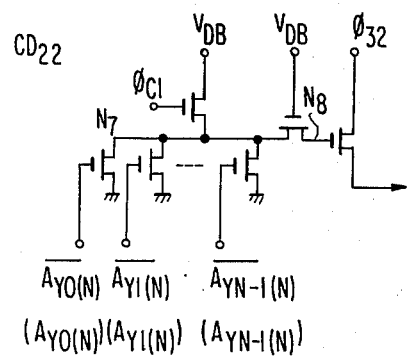
FIG. 11

SEMICONDUCTOR MEMORY DEVICE HAVING IMPROVED COLUMN SELECTION STRUCTURE

The present invention relates to a memory device, and more particularly to an IC memory device having a semiconductor integrated circuit structure.

IC memories have made a remarkable progress supported by LSI technology, and in the field of dynamic random access memories (hereinafter abbreviated as RAM) it is coming from the age of 16 K-bits to the age of 64 K-bits. In the dynamic RAMs of 16 K-bits to 64 K-bits, a multi-address system has been predominantly employed in which a row address input and a column address input can be incorporated in a multiplex fashion through a set of address terminals in response to two external clocks i.e. a row address strobe ($\overline{RAS}$) and a column address strobe ($\overline{CAS}$). The merit of the multi-address system is that the number of lines or terminals for the address input can be reduced to one half as compared to memories employing a single clock, and that a large capacity of memory can be practically provided in a small package.

A dynamic RAM necessitates refresh operations, the number of memory cells that can be refreshed in one refresh cycle is different depending upon the construction of the cell matrix. In the case of a ($m \times n$) cell matrix consisting of m row (word) lines by n column (digit) lines, n memory cells can be refreshed in one refresh cycle, and hence in order to achieve refresh of all the memory cells, m refresh cycles are necessitated. In the dynamic RAM, these refresh cycles are treated as ineffective period in which read and write cannot be effected. Therefore, the smaller the number of refresh cycles is, the more efficient memory system can be constructed. On the other hand, in a ($m \times m$) cell matrix it is difficult in view of circuit construction to extremely reduce the number m of the row lines, and hence normally the number of m=n ($n \times n$ structure) has been employed. However, in a memory having a memory capacity of 64 K-bits or higher, in order to enhance the efficiency of the memory system, a matrix construction having reduced refresh addresses such as $m = n/4 (2^{N-1} \times 2^{N+1}$ structure), $n = (n/8)(2^{N-2} \times 2^{N+1}$ structure) is required.

In such a structure of the cell matrix, however, since column addresses that are not included in the refresh addresses are increased, and the number of transistors to be used for decoding in the column decoder increases. Hence input capacitance of the column side is increased. This will result in increase of a load capacity for a column address inverter/buffer circuit which feeds address signals to the column decoder, and thus disadvantage would occur with respect to the operation speed.

Moreover, since the number of the column decoders is increased, the precharge current dissipated in the decoders would be increased as a whole.

Therefore, it is one object of the present invention to provide a memory device which can achieve high speed operations.

Another object of the present invention is to provide a memory device having a low power dissipation.

According to one aspect of the present invention, there is provided a memory device in which row address information and column address information are incorporated in synchronism with a row strobe signal and a column strobe signal, respectively, and refresh is effected in response to a row address, and in which an output of a column address inverter buffer circuit is selectively fed to a part of column decoders via a transfer gate.

According to the present invention, there is also provided a memory device comprising a memory cell matrix including a plurality of memory cell arrays having memory cells arranged in rows and columns, a first terminal for receiving a row strobe signal, a second terminal for receiving a column strobe signal, a set of address inputs terminals, first means responsive to the row strobe signal for holding first data supplied at the set of address input terminals, second means responsive to the column strobe signal for holding second data supplied at the set of address input terminals, third means for decoding a part of the first data to select the rows in the memory cell matrix, a plurality of column select means provided for each of the memory cell arrays for selecting the columns in the memory cell arrays, a plurality set of transfer gates provided for the plurality of column select means for selectively supplying one of the column select means with the second data, and fourth means for decoding remaining part of the first data to produce an array select signal for enabling one set of the transfer gates. The device may further comprises fifth means responsive to the array select signal for selectively enabling one of the column select means.

According to another feature of the present invention, there is provided a memory device employing a multi-address system in which a row strobe signal and a column strobe signal are dependently input and N row address inputs and N column address inputs are incorporated through N input terminals in a time-division manner in synchronism with the respective strobe signals; which memory device comprises a memory cell matrix consisting of $2^M$ memory cell arrays of ($2^{N-M} \times 2^N$), that is, memory cell array (1), memory cell array (2), ..., memory cell array ($2^M$). The row addresses is common to all the memory cell arrays but the column addresses are individual to the respective memory cell arrays, in which in one refresh cycle, $2^N$ memory cells in each of the memory cell array (1), memory cell array (2), ..., memory cell array ($2^M$), that is, $2^{N+M}$ memory cells in total can be refreshed. In response to a part of the row address inputs other than the refresh addresses, the outputs of a column address inverter/buffer are transmitted to only a column decoder of one memory cell array among the column decoders of the memory cell array (1), memory cell array (2), ..., memory cell array ($2^M$), while the other column decoders are held in a reset state.

According to the present invention, since the outputs of the column address inverter/buffer circuit are selectively transmitted to only a part of the column address decoders i.e. N units of decoders, only a small load capacitance is loaded upon the outputs of the column address inverter/buffer circuit. Consequently, access operations at a high speed can be realized.

Moreover, since the other unselected column address decoders are held in a reset state, no electric power is dissipated therein, and thereby the power dissipation in the entire memory device can be made small.

Above-mentioned and other features and objects of the present invention will become more apparent by reference to the following description of its prepared embodiments taken in conjunction with the accompanying drawings.

BRIEF DESCRIPTION OF THE DRAWINGS

FIG. 5 is a circuit diagram showing a row address inverter buffer circuit, FIG. 6 is a circuit diagram showing a row decoder, FIG. 7 is a circuit diagram showing a column address inverter buffer circuit, FIG. 8 is a circuit diagram showing one of two column decoders, and FIG. 9 is a circuit diagram showing the other column decoder.

FIG. 10 is a circuit diagram showing a selection timing circuit CB in FIG. 4,

FIG. 11 is a circuit diagram showing a second column timing generator in FIG. 4

Now description will be made on a memory device in the prior art with reference to FIGS. 1 and 2.

Figure 1:
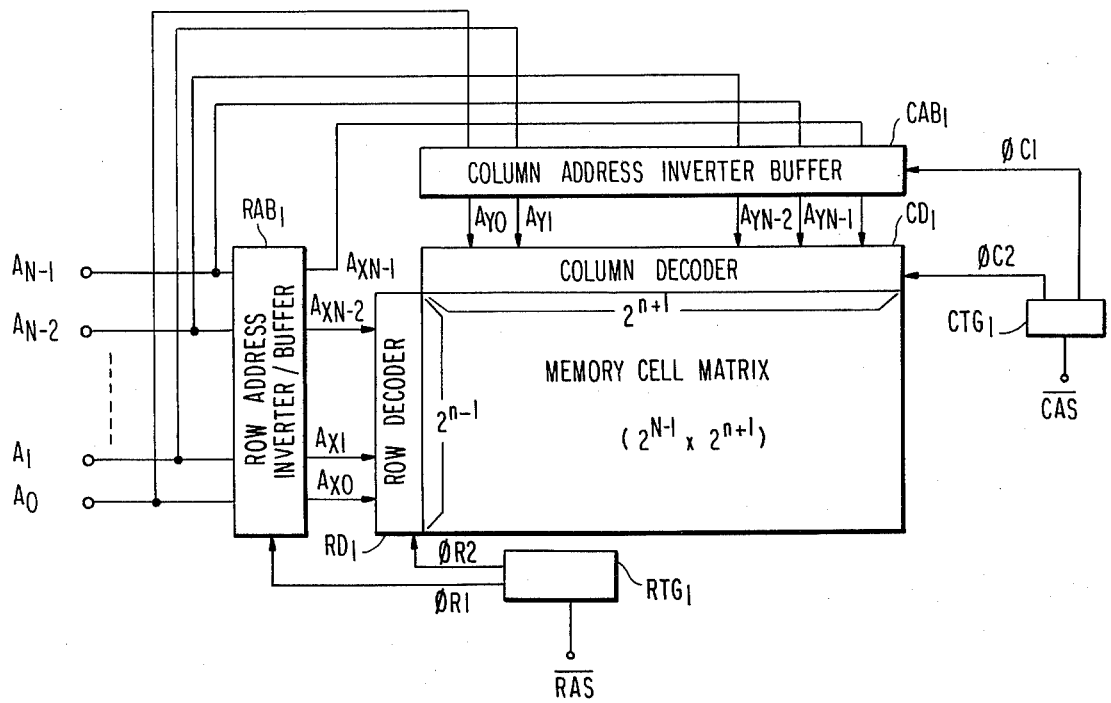
FIG. 1 is a block diagram showing a basic circuit of a memory device in the prior art.
Figure 2:
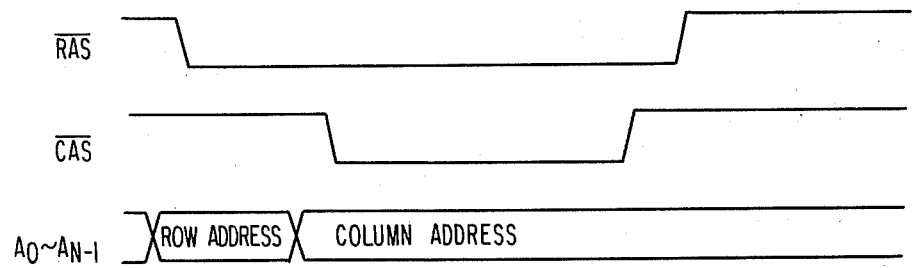
FIG. 2 is a waveform diagram showing operation waveforms in the circuit shown in FIG. 1.
Figure 2:
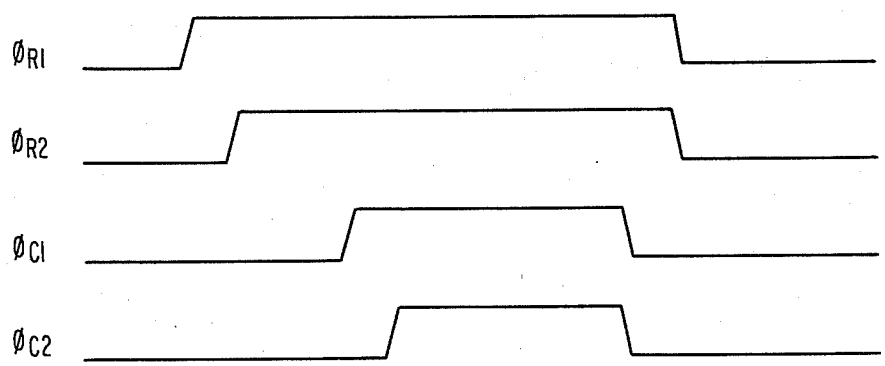

In FIG. 1, by way of example, a memory cell matrix of $2^{N-1} \times 2^{N+1}$ construction in which $m = n/4$ is chosen, is illustrated. In this memory device, a multi-address system having N bits of row address inputs and N bits of column address inputs is employed. The number of refresh addresses is $(N-1)$, and the memory cells which can be refreshed in one refresh cycle comprise $2^{N+1}$ bits. In the cell matrix construction of $2^{N-1} \times 2^{N+1}$, these are provided $2^{N-1}$ row lines corresponding to word lines and $2^{N+1}$ column lines corresponding to digit lines, and these row lines and column lines are respectively controlled by internal timing signals $\phi_{R2}$ and $\phi_{C2}$. There are provided $2^{N-1}$ row decoders RD$_1$ for selecting a row line, and the inputs of the respective row decoders are connected to outputs of $(N-1)$ row address inverter buffers RAB$_1$. On the other hand, there are provided $2^{N+1}$ column decoders CD$_1$ for selecting a column line, and the inputs of the respective column decoders are supplied to outputs of N column address inverter/buffers CAB$_1$ and an output $A_{XN-1}$ of one row address inverter/buffer other than those associated with the refresh addresses. More particularly, among the N bits row address inverter/buffer outputs adapted to be latched by the row address strobe signal $\overline{RAS}$, $(N-1)$ units of outputs are supplied to the row decoders as refresh addresses, while the remaining one output is supplied to the column decoders CD$_1$ as one bit of column. The N bits of column address inverter/buffer outputs adapted to be latched by the column address strobe signal $\overline{CAS}$ are all supplied to the column decoders CD$_1$. By means of an internal timing signal $\phi_{R1}$ generated by the row address strobe signal RAS, the N row address inverter/buffers RAS$_1$ are enabled. Among the outputs $A_{X0}, A_{X1}, \ldots,$ and $A_{XN-1}$ of the row address inverter/buffers RAB$_1$, the outputs $A_{X0}, A_{X1}, \ldots, A_{XN-2}$ which are the outputs for the refresh addresses are supplied to the row decoders RD$_1$, while the output $A_{XN-1}$ of the row address inverter/buffer which is not the output of the refresh address is supplied to the column decoders CD$_1$. In response to the results of the outputs of the row address inverter/buffers RAB$_1$, one of the levels of the $2^{N-1}$ row decoders is determined, and then one row line is selected in response to the internal timing signal $\phi_{R2}$. Subsequently, the column address strobe signal $\overline{CAS}$, and thereby N column address signal $\phi_{C1}$ that is generated by the column address strobe signal $\overline{CAS}$, and thereby N column address inverter/buffer outputs are determined at the level corresponding to the address inputs. These N bits of outputs are all supplied to the column decoders CD$_1$. In the column decoders, a level is determined by the N column address inverter/buffer outputs and the single row address inverter/buffer output other than the refresh addresses, i.e., by $(N+1)$ bits of address inverter/buffer outputs in total, and then one column line is selected in response to an internal timing signal $\phi_{C2}$. The above-mentioned is a basic operation of the illustrated prior art memory circuit, and this circuit construction is accompanied by the following disadvantages.

(1) Since the number of inputs of the column decoders is large, load capacitance for the column address inverter/buffer outputs $A_{Y0}, A_{Y1}, \ldots A_{YN-2}, A_{YN-1}$ and the one row address buffer output $A_{XN-1}$ other than the refresh addresses becomes very large, and hence this circuit construction has disadvantage in operation speed. In the illustrated circuit construction containing $2^{N-1} \times 2^{N+1}$ memory cell matrix, the number of inputs of the column decoders to be fed from each column address buffer output is $2^{N+1}$, and hence the load capacitance for the column address inverter/buffer outputs is nearly twice as large as the same load capacitance in the case of a $2^N \times 2^N$ memory cell matrix where the number of inputs of the column decoders to be fed from each column address inverter/buffer output is $2^N$.

(2) As the number of column decoders is large, a precharge current fed to the NOR circuits in the column decoder becomes very large.

(3) The above-mentioned disadvantages are amplified as the number of refresh addresses is decreased.

These disadvantages would result in delay of an access time and increase of an electric power dissipation.

Now a basic circuit system according to the present invention will be described with reference to FIG. 3 in connection to one example in which a $2^{N-1} \times 2^{N+1}$ (i.e. $M=1$) memory cell matrix is employed.

Figure 4:
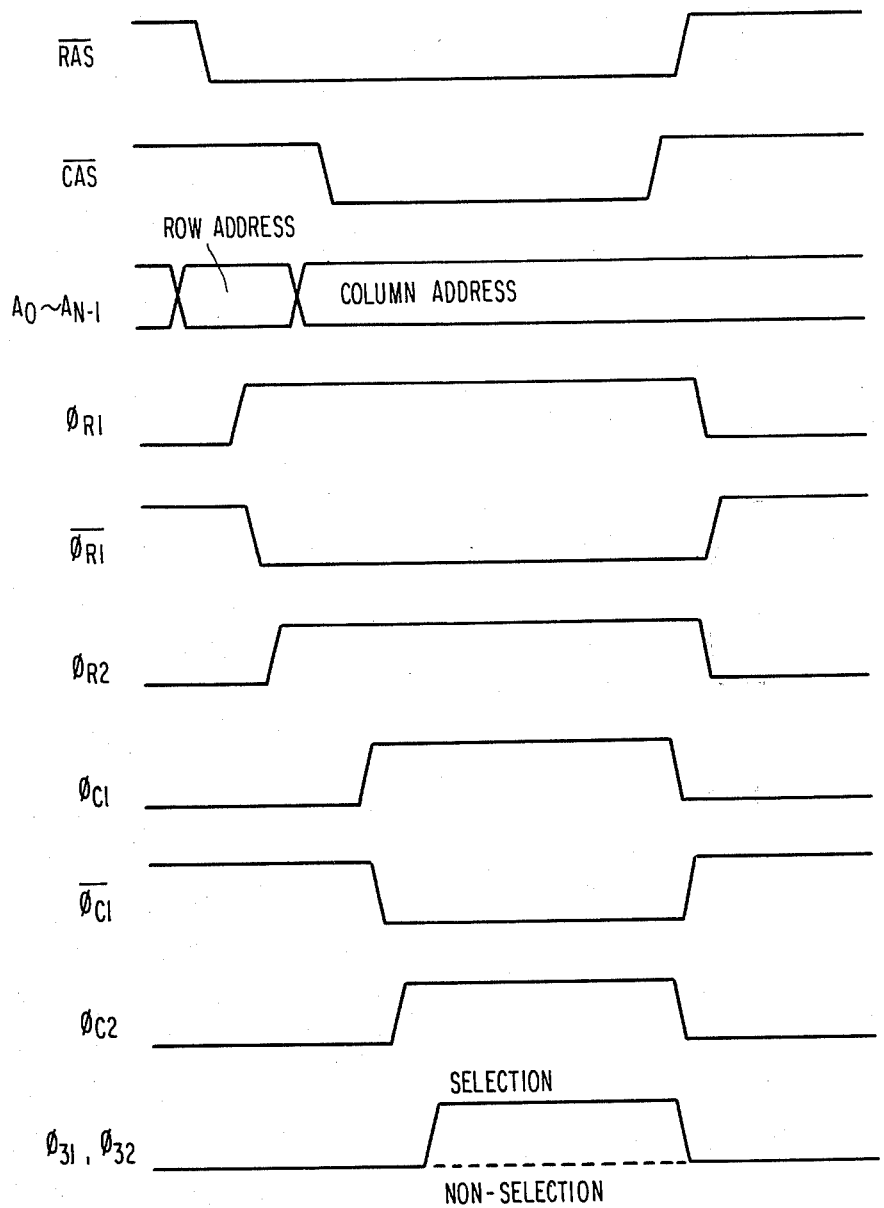
FIG. 4 is a waveform diagram showing operation waveforms in the circuit shown in FIG. 3.

The cell matrix composed of a $2^{N-1} \times 2^{N+1}$ array as a whole, consists of an array (1) MT$_{21}$ having $2^{N-1}$ (rows) $\times 2^N$ (columns) cells and the other array (2) MT$_{22}$ having row lines in common to the array (1), each having individual column decoders. A decoder circuit RD$_2$ receives $(N-1)$ pairs of true and complement outputs $A_{x0}, \overline{A_{x0}}, A_{X1}, \overline{A_{X1}} \ldots A_{XN-2}, \overline{A_{XN-2}}$ from $(N-1)$ pieces of address inverter/buffer circuits RAB$_0$, RAB$_1 \ldots,$ RAB$_{N-2}$ among N pieces of row address inverter/buffer circuits RAB$_0$–RAB$_{N-1}$ arranged in row side. The row address decoder RD$_2$ decodes $(N-1)$ pairs of the address inverter/buffer to select one of $(2^N - 1)$ word lines W$_1$–W$_{2n-1}$. Data supplied to address input terminals A$_0$, A$_1 \ldots$ A$_{N-1}$ are incorporated and held in the address inverter/buffer circuits RAB$_0$–RAB$_{N-1}$ in response to a high level of a row timing signal $\phi_{R1}$ generated by a row timing generator RTG. The row timing generator RTG generates the row timing signal $\phi_{R1}$, the level of which rises in level substantially in response to the active (low) level of the row strobe signal $\overline{RAS}$ as shown in FIG. 4. The row timing generator RTG also generates a row timing signal $\overline{\phi_{R1}}$ substantially having a reversal phase of the row timing signal $\phi_{R1}$ and a row timing signal $\phi_{R2}$ having a slightly delayed phase with respect to the row timing signal $\phi_{R2}$, as shown in FIG. 4.

The row timing signal $\overline{\phi_{R1}}$ is used to reset the row address decoder circuit RD$_2$ and the row timing signal $\phi_{R2}$ is used to enable the same. While, column decoders CD$_{21}$ and CD$_{22}$ are independently provided for the arrays (1) MT$_{21}$ and (2) MT$_{22}$, respectively. Column address inverter/buffers CAB$_0$, CAB$_1$ . . . CAB$_{N-1}$ incorporate column address data supplied at the address input terminals A$_0$-A$_{N-1}$ in response to a column timing signal $\phi_{C1}$ generated by a column timing generator CTG$_1$. The column timing generator CTG$_1$ also generates a column timing $\overline{\phi_{C1}}$ having substantially reversal phase of the column timing $\phi_{C1}$ and a column timing $\phi_{C2}$ slightly delayed from the timing $\phi_{C1}$ in response to $\overline{CAS}$ as shown in FIG. 4. True and complement address outputs (A$_{Y0}$, $\overline{A_{Y0}}$ . . . ) are supplied to inputs of the column decoder CD$_{21}$ through 2N pieces of transistors Q$_{A1}$-Q$_{A2N}$ as transfer gates and to inputs of the column decoder CO$_{22}$ through 2N pieces of transistors Q$_{B1}$-Q$_{B2N}$ as well. True and complement outputs A$_{XN-1}$ and $\overline{A_{XN-1}}$ of the row address inverter/buffer RAB$_{N-1}$ latched by the row timing signal $\phi_{R1}$ are synchronized with the column timing signal $\phi_{C2}$ to produce select signals $\phi_{XY}$ and $\phi_{X\overline{Y}}$ through a synchronized circuit CB. The circuit CB may be structured as shown in FIG. 11 in which AND logic between the signal A$_{XN-1}$ and the timing signal $\phi_{C1}$ is performed by a transistor Q$_{t1}$ to produce the signal $\phi_{XY}$ and AND logic between the signal $\overline{A_{XN-1}}$ and the signal $\phi_{C1}$ is performed by a transistor Q$_{t2}$ to produce signal $\phi_{X\overline{Y}}$.

Figure 12:
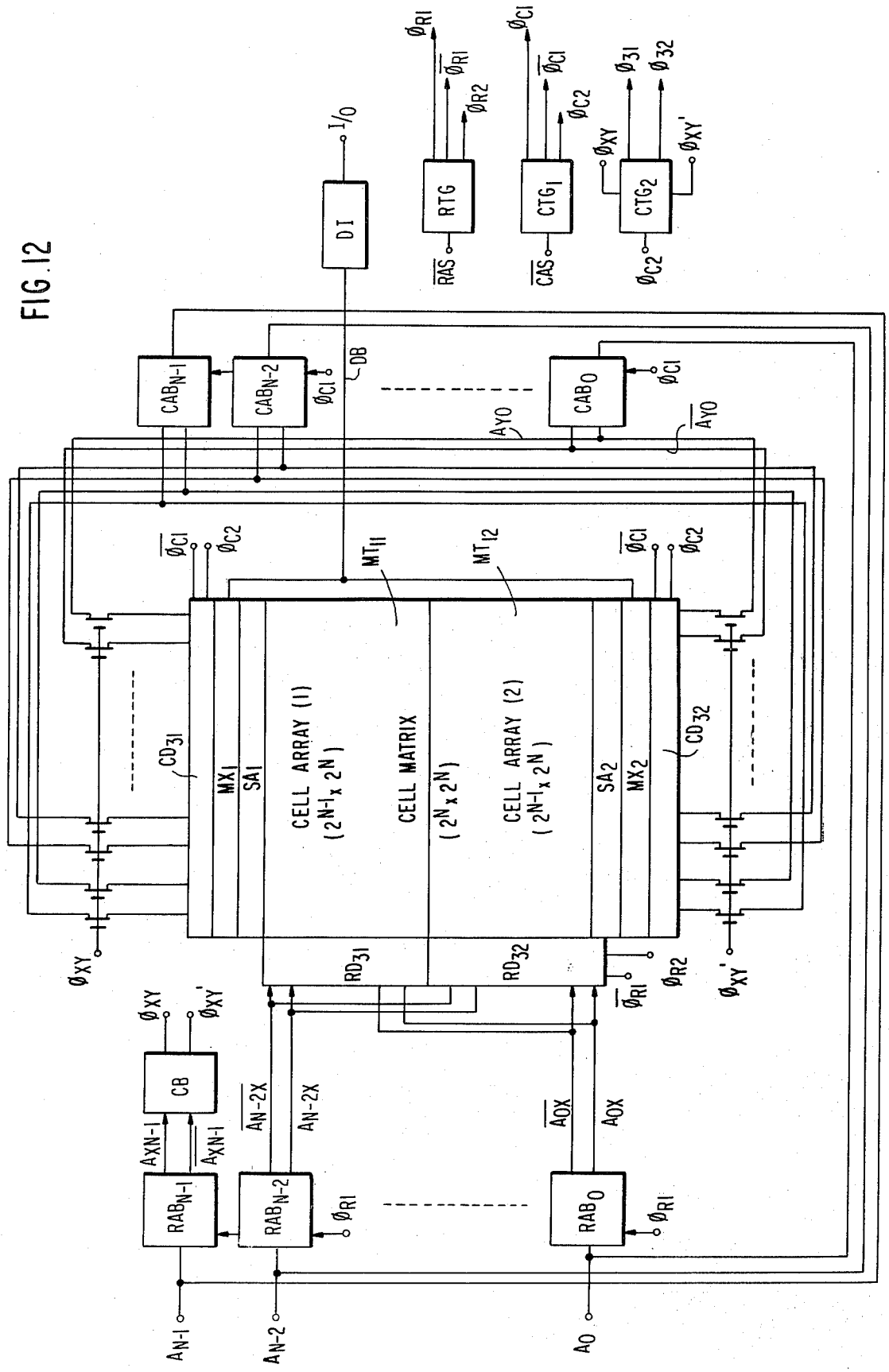
FIG. 12 is a block diagram showing a memory device according to another preferred embodiment of the present invention.

The select signal $\phi_{XY}$ is supplied to gates of the transistors Q$_{A1}$, Q$_{A2}$ . . . Q$_{A2N}$ in common, while the select signal $\phi_{X\overline{Y}}$ is commonly supplied to gates of the transistors Q$_{B1}$, Q$_{B2}$ . . . Q$_{B2N}$. Thus, a set of the true and complement outputs of the column address inverter/buffers are selectively supplied to either of the column decoders CD$_{21}$ and CD$_{22}$ dependent on one bits of the row address input. The column decoder CD$_{21}$ is reset by the timing signal $\overline{\phi_{C1}}$ and enabled by a select timing signal $\phi_{31}$ generated by a select timing signal generator CTG$_2$. The column decoder CD$_{22}$ is reset by the timing signal $\overline{\phi_{C1}}$ and enabled by a select timing signal $\phi_{32}$. As shown in FIG. 12, the select timing signal $\phi_{31}$ is generated by a transistor Q$_{t3}$ based on AND logic between the timing signal $\phi_{C2}$ and the select timing signal $\phi_{XY}$ in the select timing signal generator CTG$_2$. Similarly, the select timing signal $\phi_{32}$ is generated by a transistor Q$_{t4}$ based on AND logic between the signal $\phi_{C2}$ and the signal $\phi_{X\overline{Y}}$. Thus to the column decoders for the unselected array (1) or (2) are not transmitted the column address inverter/buffer outputs, and unselected column decoders is held in a reset state. Further, the select timing signals $\phi_{31}$ and $\phi_{32}$ are controlled by the row address buffer outputs A$_{XN-1}$ and $\overline{A_{XN-1}}$ other than the refresh addresses so that only the column decoders associated with one selected array may be activated but the column decoders associated with the other array may be held in a reset state.

$2^N$ units of outputs of the column decoder CD$_{21}$ are fed to a multiplexer circuit MX$_1$. $2^N$ units of output of the column decoder CD$_{22}$ are fed to a multiplexer circuit MX$_2$. The multiplexer circuits MX$_1$ and MX$_2$ selectively couples one of digit lines arranged in column to a data bus line DB connected to a data interface circuit DI through which read-out data is fed to a data terminal I/O or write data applied to the terminal I/O is input. In a sense amplifier section SA$_1$, $2^N-1$ pieces of differential type sense amplifiers each having two inputs coupled to two digit lines are provided as known manner. In a sense amplifier section SA$_2$, $2^N-1$ pieces of sense amplifiers are similarly provided.

Now the structures and operations of the respective parts of the above-described memory device according to the present invention will be described in greater detail with reference to FIGS. 5 to 11.

Figure 3:
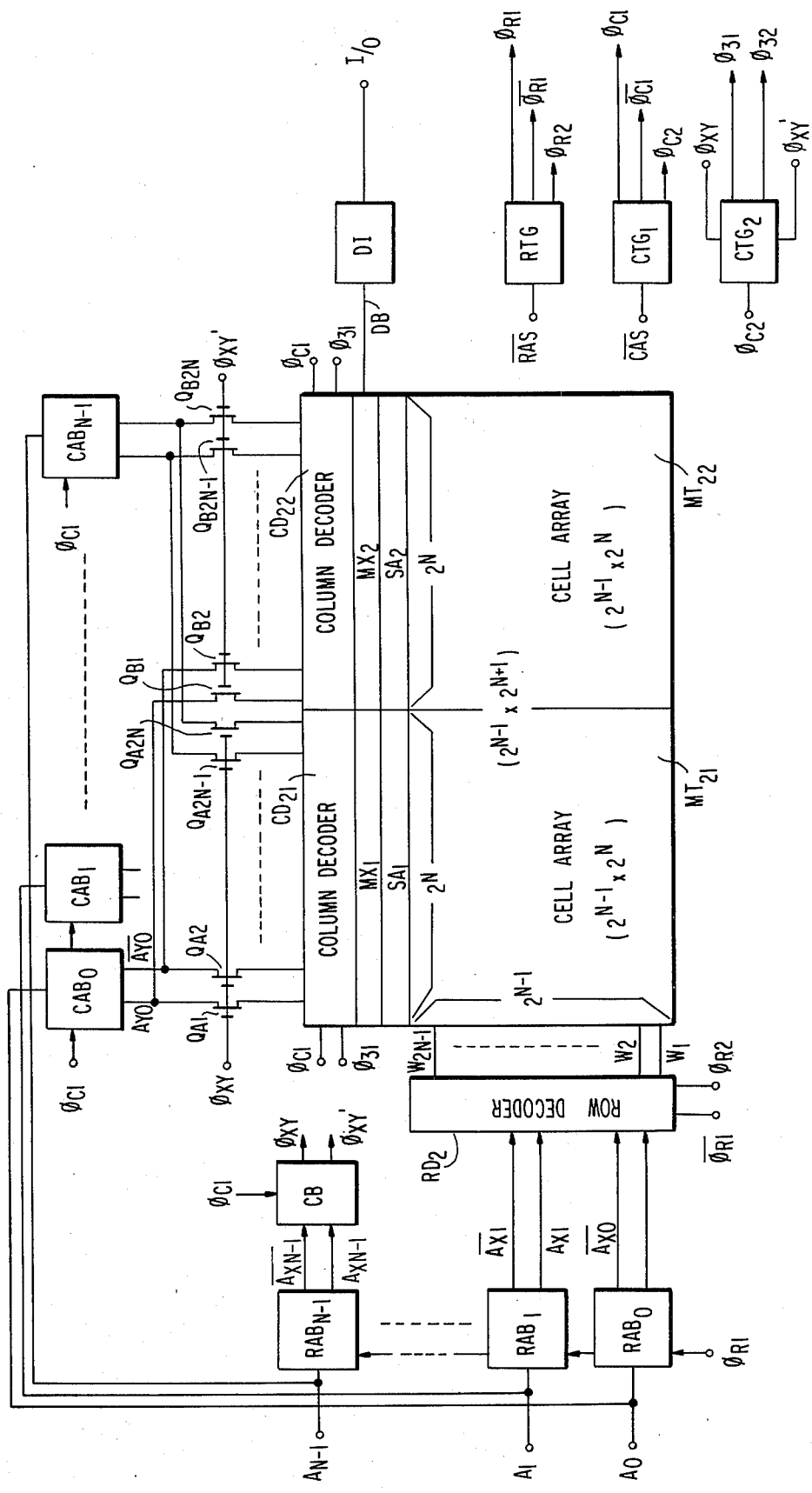
FIG. 3 is a block diagram showing a memory device according to one preferred embodiment of the present invention.

In the row timing signal generator RTG shown in the right lower portion of FIG. 3, the timing signals $\phi_{R1}$, $\overline{\phi_{R1}}$ and $\phi_{R2}$ are derived from the row address strobe signal $\overline{RAS}$. Likewise, in the first column timing signal generator CTG$_1$ shown in the same portion, the timing signals $\phi_{C1}$, $\overline{\phi_{C1}}$ and $\phi_{C2}$ are derived from the column address strobe signal $\overline{CAS}$, and in the second column timing signal generator CTG$_2$ shown in the same portion, the selection timing signal, $\phi_{31}$ or $\phi_{32}$ are derived from the timing signal $\phi_{C2}$ depending upon whether the signal $\phi_{XY}$ or $\phi_{X\overline{Y}}$ is active.

N row address buffers RAB (that is, RAB$_0$, RAB$_1$ . . . RAB$_{N-1}$) are enabled by the timing signal $\phi_{R1}$. As seen from FIG. 5 which specifically illustrates the N-th row address buffer RAB$_{N-1}$, the levels at the respective junction points in the three stages of inverters forming the row address inverter/buffer are determined in response to the timing signal $\phi_{R1}$ in such manner that the levels at a junction N$_1$ and at a junction $\overline{A_{Xi}}$ (a complementary output of a row address buffer RAB$_i$) are of opposite phase to the level at an input A$_i$, and the level at a junction A$_{Xi}$ (a true output of a row address buffer RAB$_i$) may be of in-phase with the level at the input A$_i$ (FIG. 5). Among these outputs A$_{Y0}$ ($\overline{A_{Y0}}$), A$_{Y1}$ ($\overline{A_{Y1}}$), . . . A$_{XN-1}$ ($\overline{A_{XN-1}}$), the outputs for refresh addresses A$_{Y0}$ ($\overline{A_{Y0}}$), A$_{X1}$ ($\overline{A_{X1}}$), . . . A$_{XN-2}$ ($\overline{A_{XN-2}}$) are connected to the row decoders RAB$_0$ . . . , RAB$_{N-2}$, but the row address buffer outputs A$_{XN-1}$ ($\overline{A_{XN-1}}$) other than the refresh addresses are supplied to the circuit CB which controls the inputs of the column decoders.

The row decoder RD consists of NOR circuits each having either one of the true and complementary output signals of each row address inverter/buffer assigned to the refresh address applied to an input of each NOR circuit therein and a driver section for driving one row line wi in response to an internal timing signal $\phi_{R2}$ as shown in FIG. 6, and only the output of the row decoder in which all the address inverter/buffer outputs connected to its inputs are at "0" level, is activated by the timing signal $\phi_{R2}$. Likewise, each column address buffer CAB is activated by the internal timing signal $\phi_{C1}$ generated in response to the column address strobe signal $\overline{CAS}$ as shown in FIG. 7, and it provides true and complementary column address outputs in response to the respective address inputs A$_0$, A$_1$, . . . , A$_{N-1}$.

The outputs A$_{Y0}$ ($\overline{A_{Y0}}$), A$_{Y1}$ ($\overline{A_{Y1}}$), . . . , A$_{YN-1}$ ($\overline{A_{YN-1}}$) of these N column address buffers CAB are controlled by the outputs $\phi_{XY}$ and $\phi_{X\overline{Y}}$ of the block circuit CB which has the row address buffer outputs A$_{XN-1}$ ($\overline{A_{XN-1}}$) other than the refresh address outputs connected to its inputs, so that it may be determined whether the outputs A$_{Y0}$ ($\overline{A_{Y0}}$), A$_{Y1}$ ($\overline{A_{Y1}}$), . . . A$_{YN-1}$ ($\overline{A_{YN-1}}$) are to be coupled to one column decoder (1) CD$_{21}$ constructed as shown in FIG. 8 or to the other column decoder (2) CD$_{22}$ constructed as shown in FIG. 9. In other words, the row address output A$_{XN-1}$ other than the refresh address outputs serves to determine whether the memory cell array (1) is to be selected or the memory cell array (2) is to be selected. The inputs of the column decoders on the side of the unselected array are held in a reset state. Accordingly, the NOR circuits in the column decoders on the side of the unelected array also sustain their reset state. Furthermore, the selection timing signals $\phi_{31}$ and $\phi_{32}$ are also controlled by the circuit CB so that one activation signal only, that is, only the activation signal on the side of the selected array is activated and the activation signal on the side of the unselected array is kept in a reset state. Accordingly, the memory cell array and the column decoders on the unselected side make no change from the reset state. The above-mentioned is the basic circuit system according to the present invention and its basic operations, and the circuit system and operations have the following characteristics advantages:

(1) Since the column address inverter/buffer outputs are supplied to only one-half of the column decoders, the load capacitance for the inverter/buffer outputs is reduced and hence enhancement of the operation speed becomes possible.

(2) Column decoders which operate in response to the activation signal are only one set of column decoders in the plurality of sets of equipped column decoders, the unselected column decoders necessitate no reset operation nor precharge operation, and therefore, the electric power dissipation in the entire column decoders can be reduced to about one-half.

(3) Since the selection of the memory cell arrays are determined by the row address strobe signal RAS and when the column address strobe signal CAS is made at its active level it has been already determined which memory cell array should be selected, the connection of the data bus DB to the interface circuit upon read and the connection of the same upon write are allowed to have a margin of time as compared to the system in which the memory cell arrays are selected only in response to the column address strobe signal $\overline{CAS}$, and therefore, speed-up of the $\overline{CAS}$ access time, reduction of the write width and enlargement of the operation margin can be achieved.

Another preferred embodiment of the present invention is illustrated in FIG. 12, in which the internal timing relationships are similar to those shown in FIG. 4.

This embodiment differs from the preceding embodiment in that two memory cell arrays MT$_{11}$ and MT$_{12}$ are arranged in column direction and that two row decoders RD$_{31}$ and RD$_{32}$ are provided respectively for the arrays MT$_{11}$ and MT$_{12}$. The portions and the signals corresponding to those in the preceeding embodiment are indicated by the same reference codes. In this embodiment, words lines arranged in rows and digit lines arranged in column are independent in the respective memory cell arrays. The row decoders RD$_{31}$ and RD$_{32}$ have (N−1) row address inverter/buffer outputs for the refresh addresses connected as their inputs to select one of $2^{N-1}$ word lines respective in the arrays MT$_{11}$ and MT$_{12}$. Outputs of N column address inverter/buffer circuits CAB$_0$-CAB$_{N-1}$ are controlled by the outputs of the row address inverter/buffer RAB$_{N-1}$ other than the refresh address so that they may be supplied selectively and individually to the column decoders CD$_{31}$ for the first array MT$_{11}$ or to the column decoders CD$_{32}$ for the second array MT$_{12}$. In a row timing signal generator RTG, the timing signals $\phi_{R1}$, $\overline{\phi_{R1}}$ and $\phi_{R2}$ are generated in response to the row address strobe signal $\overline{RAS}$, and the row address inverter/buffers are enabled by the timing signal $\phi_{R1}$. Among the N units of row address inverter/buffer outputs, N−1 units of outputs for the refresh addresses A$_{X0}$, $\overline{A_{X0}}$, A$_{X1}$, $\overline{A_{X1}}$ ... A$_{XN-2}$ are supplied to two sets of row decoders, and after the level of the row decoders has been determined, one row line for each memory cell array MT$_{11}$ or MT$_{12}$, that is, two row lines in total are selected by the signal $\phi_{R2}$. The one row address buffer output other than the refresh addresses is used as a selection signal for the two sets of column decoders CD$_{31}$ and CD$_{32}$. N units of column address inverter/buffers are activated by an internal timing signal $\phi_{C1}$ generated in a column timing signal generator CTG$_1$ in response to the column address strobe signal $\overline{CAS}$, and thereby the output level of the column address buffers is determined. The outputs of these column address buffers are controlled by the abovementioned column decoder selection signal, so that the buffer outputs may be connected to only one set of column decoders in response to the row address signal other than the refresh signals, whereby the level of only the column decoders for the selected memory cell array can be determined. On the other hand, the column decoders for the unselected memory cell array are held in a reset state. Furthermore, in the two column decoder the timing signals $\phi_{31}$ and $\phi_{32}$, only the timing signal for the memory cell array selected in response to the row address signal other than the refresh addresses is activated, and the other signal is kept in a reset state. In this modified embodiment also, speed-up of the column address buffer operations and reduction of the electric power dissipation can be expected, because among the two memory cell arrays, only the column decoders for one memory cell array operate in response to the level of the row address other than the refresh addresses and the column decoder for the other memory cell array is held in a reset state. Moreover, according to this modified embodiment, since there are provided two sets of row decoders, respectively, independently of the memory cell arrays, in the memory cell array on the unselected side it becomes possible to effect resetting of a row line, resetting of a row decoder and precharging in the latter half of the activation period.

The preferred embodiment of the present invention illustrated in FIG. 12 has characteristic advantages that since the memory cell matrix takes the form of $2^N \times 2^N$ (two arrays each consisting of $2^{N-1} \times 2^N$), 16-pin structured package is facilitated, and that since the length of the row lines is reduced to one-half as compared to the basic circuit shown in FIG. 3, speed-up of the operation can be achieved and also the row lines can be formed of polysilicon instead of aluminum wirings (owing to the reduced delay).

While the above-described preferred embodiments have been explained, by way of example, with respect to the case where (N−1) refresh addresses are provided, the present invention is equally applicable to the case where the number of refresh addresses is (N−2), (N−3), ..., etc.

As fully described above, by employing the circuit system according to the present invention it is possible to realize a memory device that can operate at a high speed with low power dissipation.

I claim:

1. A memory device comprising a memory cell matrix including a plurality of memory cells arrayed in rows and columns, said columns being divided into a plurality of column groups each having the same plural number of columns; a first terminal for receiving a row strobe signal; a second terminal for receiving a column strobe signal; a set of address input terminals; first means responsive to said row strobe signal for storing a first group of address signals from said set of address input terminals; second means responsive to said column strobe signal for storing second group of addrss signals from said set of address input terminals; third means responsive to a first part of said first group of address signals for selecting one of said rows; a plurality of column select means associated with the respective column groups, each of said column select means selecting one of said columns in the associated column group; a plurality of transfer gates associated with the respective column select means, each of said transfer gated being adapted to supply said second group of address signals to the associated column select means; and fourth means responsive to a second part of said first group of address signals for selecting one of said transfer gates to activate the selected transfer gate, whereby said second group of address signals are supplied only to one column select means associated with said selected transfer gate.

2. The memory device according to claim 1, further comprising means responsive to said second part of said first group of address signals for selectively enabling said one column select means associated with said selected transfer gate.

3. The device according to claim 1, in which refresh operation is effected in accordance with an address of said rows.

4. A memory circuit comprising a first memory cell array; a second memory cell array, each of said arrays including a plurality of memory cells arrayed in rows and columns; means for electrically connecting rows of said first memory cell array to rows of said second memory cell array; means for receiving a plurality of address signals; first column selecting means for selecting columns of said first memory cell array; second column selecting means for selecting columns of said second memory cell array independently of said first column selecting means; a first column address signal transfer means coupled to said first column selecting means; a second column address signal transfer means coupled to said second column selecting means; means for supplying column address signals to said first and second column address signal transfer means; and means for activating a selected one of said first and second column address signal transfer means.

5. The memory circuit according to claim 4, further comprising means for disenabling the non-selected one of said first and second column address signal transfer means.

6. The memory circuit according to claim 4, in which each of said column address signal transfer means includes a plurality of insulated gate field effect transistors.

7. The memory circuit according to claim 4, further comprising means coupled to said receiving means for preparing said column address signals, row address signals and a selecting signal; and a row selecting means responsive to said row address signals for selecting each one of rows of said first and second memory cell arrays, said activating means being responsive to said selecting signal.

8. A memory device comprising a plurality of memory cell arrays, each of said memory cell arrays including a plurality of memory cells arranged in rows and columns; a plurality of row address inverter buffer circuits; a plurality of column address inverter buffer circuits; a row decoder circuit having a plurality of row decode outputs; means for applying said plurality of row decode outputs to the respective rows in said plurality of memory cell arrays; a plurality of column decoder circuits associated with the respective memory cell arrays, each of said column decoder circuits having a plurality of column decode outputs; a plurality of means for applying the column decode outputs of said column decoder circuits to columns of the associated memory cell arrays; a plurality of transfer gate groups coupled between said plurality of column address inverter buffer circuits and each of said column decoder circuits, each of said transfer gate groups including the same plural number of transfer gates; a plurality of control lines provided for the respective transfer gate groups, each of said control lines being connected to an associated control terminal of the transfer gate belonging to each transfer gate group; means for supplying a first part of the output signals of said plurality of row address inverter buffer circuits to said row decoder circuit; a control decode circuit for selecting one of said control lines; and means for applying a second remaining part of the output signals of said row address inverter buffer circuits to said control decode circuits.

* * * * *

UNITED STATES PATENT AND TRADEMARK OFFICE
CERTIFICATE OF CORRECTION

PATENT NO. : 4,354,259
DATED : October 12, 1982
INVENTOR(S) : Shoji ISHIMOTO

It is certified that error appears in the above—identified patent and that said Letters Patent is hereby corrected as shown below:

Column 7, line 17, change "characteristics" to

--characteristic--.

Column 8, line 19, change "abovementioned" to --abovementioned--.

Signed and Sealed this

Twenty-second Day of February 1983

[SEAL]

Attest:

GERALD J. MOSSINGHOFF

Attesting Officer    Commissioner of Patents and Trademarks